(12) United States Patent
Lai et al.

(10) Patent No.: US 12,451,398 B2
(45) Date of Patent: Oct. 21, 2025

(54) GALLIUM NITRIDE-BASED DEVICES AND METHODS OF TESTING THEREOF

(71) Applicant: Taiwan Semiconductor Manufacturing Company, Ltd., Hsinchu (TW)

(72) Inventors: Yi-An Lai, Taipei (TW); Pen Chieh Yu, Hsinchu (TW); Chan-Hong Chern, Palo Alto, CA (US); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 577 days.

(21) Appl. No.: 17/863,069

(22) Filed: Jul. 12, 2022

(65) Prior Publication Data

US 2023/0369147 A1    Nov. 16, 2023

Related U.S. Application Data

(60) Provisional application No. 63/340,888, filed on May 11, 2022.

(51) Int. Cl.
*H01L 21/66* (2006.01)
*G01R 31/52* (2020.01)
(Continued)

(52) U.S. Cl.
CPC .............. *H01L 22/34* (2013.01); *G01R 31/52* (2020.01); *H01L 22/14* (2013.01); *H10D 30/475* (2025.01);
(Continued)

(58) Field of Classification Search
CPC ......... H01L 22/34; H01L 22/14; G01R 31/52; G01R 31/2621; H10D 30/475;
(Continued)

(56) References Cited

U.S. PATENT DOCUMENTS 6,150,669 A  * 11/2000 Nandakumar .......... H01L 22/34
257/401
6,452,412 B1 *  9/2002 Jarvis ................. G01R 31/2831
438/18
(Continued)

FOREIGN PATENT DOCUMENTS

CN          104062485  A  *  9/2014
CN          107919291  A     4/2018
(Continued)

*Primary Examiner* — Joseph C. Nicely
(74) *Attorney, Agent, or Firm* — FOLEY & LARDNER LLP

(57) ABSTRACT

A semiconductor device includes a transistor comprising: a plurality of layers, wherein each of the plurality of layers has at least one Group III-V compound material; a gate electrode operatively coupled to at least one of the plurality of layers; a source electrode disposed on a first side of the gate electrode; a drain electrode disposed on a second side of the gate electrode; a field plate disposed between the gate electrode and the drain electrode; and a plurality of conductive lines disposed above the gate electrode, the source electrode, and the drain electrode. The semiconductor device further includes a plurality of test structures, wherein each of the test structures, including a first metal pattern and a second metal pattern, emulates at least one of the gate electrode, the source electrode, the drain electrode, the field plate, or at least one of the plurality of conductive lines.

20 Claims, 12 Drawing Sheets

(51) Int. Cl.
    *H10D 30/47*     (2025.01)
    *H10D 64/00*     (2025.01)
    *G01R 31/26*     (2020.01)
    *H10D 62/85*     (2025.01)

(52) U.S. Cl.
    CPC ....... *H10D 30/4755* (2025.01); *H10D 64/111* (2025.01); *H10D 64/112* (2025.01); *G01R 31/2621* (2013.01); *H10D 62/8503* (2025.01)

(58) Field of Classification Search
    CPC ........... H10D 30/4755; H10D 62/8503; H10D 64/111; H10D 64/112
    See application file for complete search history.

(56)     References Cited

U.S. PATENT DOCUMENTS

| | | | |
|---|---|---|---|
| 7,132,683 B1 * | 11/2006 | Krishnan | H10D 86/201 |
| | | | 257/40 |
| 7,932,103 B2 * | 4/2011 | Subba | H01L 22/14 |
| | | | 438/11 |
| 8,580,626 B2 | 11/2013 | Cheng et al. | |
| 9,786,571 B1 * | 10/2017 | Zhang | H01L 23/4824 |
| 11,164,800 B2 * | 11/2021 | Hsu | H10D 84/0151 |
| 12,224,216 B2 * | 2/2025 | Li | H01L 22/34 |
| 2007/0089540 A1 * | 4/2007 | Brazis | H01L 22/14 |
| | | | 73/863 |
| 2019/0271737 A1 * | 9/2019 | Zhang | G01R 31/2644 |
| 2020/0166566 A1 * | 5/2020 | Sengupta | G01R 31/2836 |
| 2020/0256915 A1 * | 8/2020 | Choi | H01L 23/481 |
| 2022/0208975 A1 * | 6/2022 | Khalil | H10D 62/8503 |
| 2023/0308052 A1 * | 9/2023 | Maalouf | H03F 1/0211 |

FOREIGN PATENT DOCUMENTS

| | | | | |
|---|---|---|---|---|
| CN | 210535674 U | * | 5/2020 | ......... H10D 30/6729 |
| DE | 102009058427 A1 | * | 11/2010 | ............ H02M 3/073 |
| DE | 10 2021 121 938 A1 | | 3/2022 | |
| TW | 202205589 A | | 2/2022 | |
| WO | WO-2006/012293 A1 | | 2/2006 | |

* cited by examiner

GALLIUM NITRIDE-BASED DEVICES AND METHODS OF TESTING THEREOF

CROSS-REFERENCE TO RELATED APPLICATION

This application claims priority to and the benefit of U.S. Provisional Application No. 63/340,888, filed May 11, 2022, entitled "A NOVEL GAN DETECTION APPARATUS AND METHOD," which is incorporated herein by reference in its entirety for all purposes.

BACKGROUND

Over the past several decades, silicon-based electronic devices (e.g., Metal-Oxide-Semiconductor Field-Effect-Transistors (MOSFETs)) have been fairly successful and represent the present standard for power applications (e.g., AC/DC supplies, DC/DC supplies, and motor controls) ranging from just tens of watts up to hundreds and even thousands of watts. Such silicon-based electronic devices have seen continual improvements in key parameters such as on-resistance $R_{DS(ON)}$, voltage ratings, switching speed, packaging, and other attributes. However, the rate of improvements in these silicon-based electronic devices has leveled off, as their performance is now close to the theoretical limit as determined by the underlying fundamental physics of these materials and processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
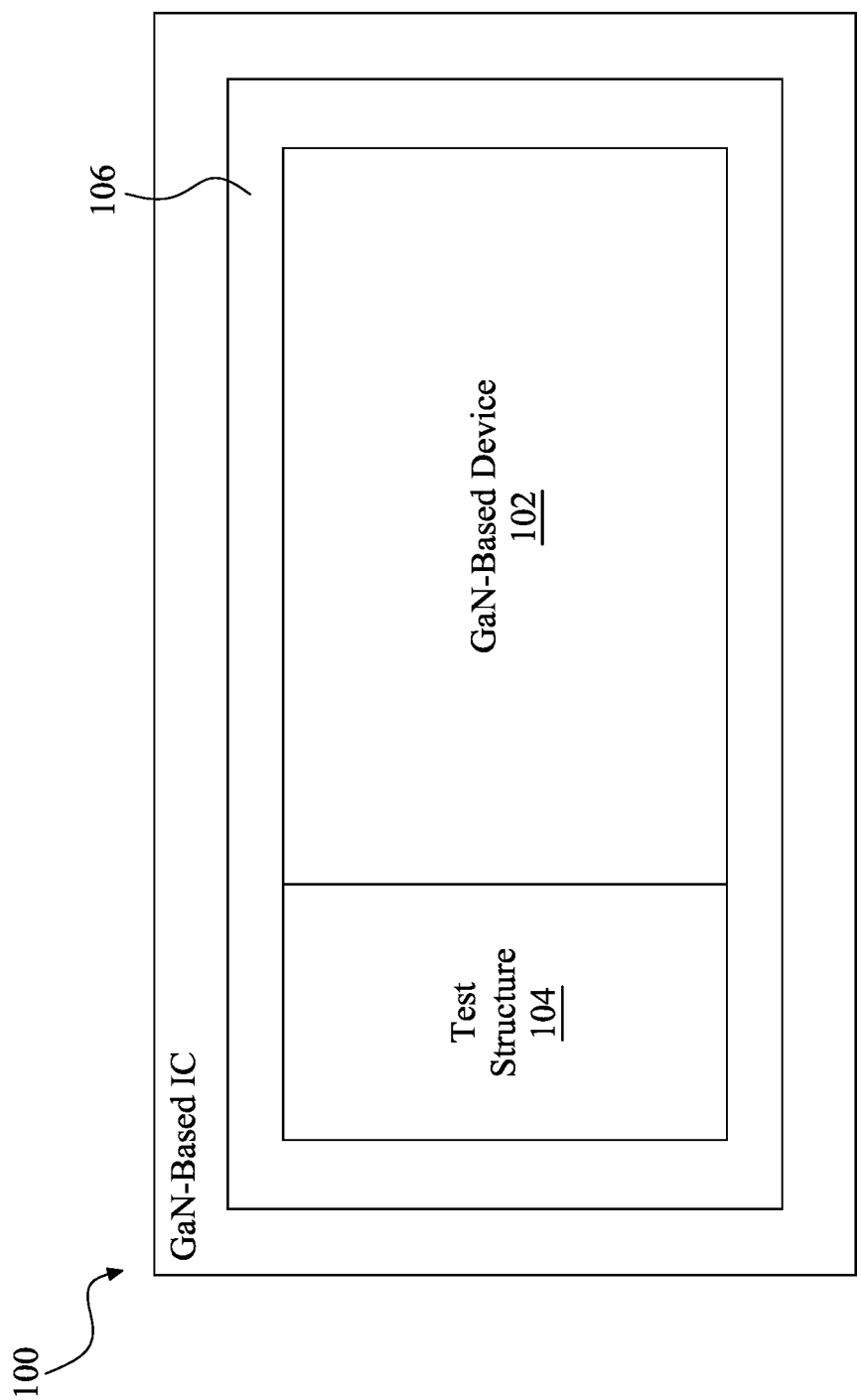
FIG. 1 illustrates a block diagram of a GaN-based integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Group III-Group V (or Group III-V) semiconductor compound materials are generally considered as one of replacement materials for silicon, because of their supreme material characteristics when compared to silicon. For example, gallium nitride (GaN)-based materials have been widely investigated in a variety of electronic and/or optoelectronic applications. The GaN-based material typically refers to gallium nitride (GaN) and its alloys such as, for example, aluminum gallium nitride (AlGaN), indium gallium nitride (InGaN), and aluminum indium gallium nitride (AlInGaN). In particular, the GaN-based material is a wide bandgap semiconductor and is able to maintain its electrical performance at higher temperatures as compared to other semiconductors, such as silicon or gallium arsenide. The GaN-based material also has a higher carrier saturation velocity compared to silicon. Additionally, the GaN-based material has a Wurtzite crystal structure, is a hard material, has a high thermal conductivity, and has a much higher melting point than other conventional semiconductors such as silicon, germanium, and gallium arsenide. Accordingly, the GaN-based material is useful for high-voltage and high-power applications.

Although GaN-based optoelectronic and electronic devices are of tremendous commercial importance, the quality and reliability of these devices, however, is commonly compromised by relatively high defect levels in one or more of the semiconductor layers formed therein. Such defects can, for example, arise from: (1) lattice mismatch of GaN-based semiconductor layers to a non-GaN substrate such as silicon, sapphire, or silicon carbide; (2) the coalescence fronts of epitaxially-overgrown layers; (3) thermal expansion mismatch; (4) impurities; and (5) tilt boundaries. The presence of defects has a deleterious effect on epitaxially-grown layers. Such effect includes compromised electronic/optoelectronic device performance.

Even though some techniques have been proposed to identify some of the defects in the GaN-based devices (e.g., GaN-based high-voltage devices), these techniques still cannot efficiently identify a fair amount of defects. For example, the GaN-based high-voltage device is generally formed as a lateral device in order to enlarge its drift region (so as to boost its breakdown voltage accordingly). Accordingly, the dimensions of various components (e.g., a pitch/spacing between device features) of the GaN-based high-voltage device are generally formed larger, when compared to the Si-based high-voltage device. As such, when a defect is small enough and present between such relatively widely spaced device features, the defect cannot be detected using any of the existing techniques. Thus, the existing GaN-based high-voltage devices or techniques to detect defects within such devices have not been entirely satisfactory in many aspects.

The present disclosure provides various embodiments of a GaN-based integrated circuit that includes a GaN-based device and one or more test structures. The test structures can each emulate the GaN-based device, allowing defects of the GaN-based device to be efficiently and accurately detected. According to one aspect of the present disclosure, some of the test structures can each be formed as an alternately arranged structure. For example, the test structure can have a first pattern and a second pattern with their respective portions laterally disposed next to each other (e.g., with a substantially smaller pitch in comparison with a pitch of the to-be-detected GaN-based device). According to another aspect of the present disclosure, some of the test structures can each be formed as a metal-insulator-metal (MIM) structure. For example, the test structure can have a first pattern and a second pattern with their respective portions vertically overlapped with each other. In any of the alternately arranged structure or MIM structure, the first pattern and second pattern can emulate similar or different device features of the GaN-based device by being concurrently fabricated with those emulated device features. In this way, when there is a defect produced during fabricating the device features of the GaN-based device, it is highly likely that such a defect is also present in the concurrently formed test structure. The existing techniques (e.g., measuring various electrical characteristics of the GaN-based device) may not efficiently detect the defect, since the defect (in a smaller dimension) may be present in a spacing between relatively widely spaced device features. By contrast, the patterns of the disclosed test structure, in flexibly configured dimensions and profiles, can quickly detect such a defect. Further, as the patterns of the test structure can be concurrently formed with any of the device features, a location and/or type of the defect can be accurately determined by the test structure.

FIG. 1 illustrates an example block diagram of a GaN-based integrated circuit 100, in accordance with various embodiments. It should be understood that the block diagram of FIG. 1 is simplified for illustration purposes. Thus, the GaN-based integrated circuit 100 can include any of various other (e.g., functional) blocks, while remaining within the scope of present disclosure.

As will be discussed below, the GaN-based integrated circuit 100 includes a number of (e.g., electronic) components formed based on a GaN-based material such as, for example, gallium nitride (GaN) and its alloys such as aluminum gallium nitride (AlGaN), indium gallium nitride (InGaN), and aluminum indium gallium nitride (AlInGaN). Example of these components include, but are not limited to, transistors, resistors, capacitors, diodes, etc. Such a GaN-based material may be epitaxially grown on a non-GaN-based material that functions as a substrate for the GaN-based integrated circuit 100 such as, for example, silicon, sapphire, and/or silicon carbide. The GaN-based integrated circuit 100 may be implemented as a single system-on-a-chip (SoC) architecture or a multi-SoC architecture. Accordingly, the GaN-based integrated circuit 100 may be formed on a single substrate or on multiple substrates.

As shown, the GaN-based integrated circuit 100 includes at least one GaN-based device (or circuit) 102 and at least one test structure 104. The GaN-based device 102 and the test structure 104 may be surrounded by a ring structure (e.g., implemented as an isolation structure) 106. In some embodiments, the GaN-based device 102 may include a GaN-based high-voltage device that has a number of its active components formed of the above-listed GaN-based materials (which will be discussed further below in FIG. 3). For example, the GaN-based device 102 can sustain operation under a voltage range of over 40 volts (for example, voltages around 600 volts), but the GaN-based device 102 can operate with any of various other voltage ranges, while remaining within the scope of present disclosure. The test structure 104 may include a first conductive (e.g., metal) pattern and a second conductive (e.g., metal) pattern that emulate one or more conductive (e.g., metal) components included in the GaN-based device 102, respectively (which will be discussed further below in FIGS. 4-9).

In the example block diagram of FIG. 1, the GaN-based device 102 and the test structure 104 is disposed immediately next to each other, e.g., the GaN-based device 102 and the test structure 104 being formed in respectively different regions of the same semiconductor die. However, it should be understood that real estate of the GaN-based device 102 and the test structure 104 may be configured differently, while remaining within the scope of the present disclosure. For example, the test structure 104 may not be present on a semiconductor die (e.g., a singulated or cut die). While the GaN-based device 102 is formed on a particular die over a wafer, the corresponding test structure 104 may be formed along one or more scribe lines over the wafer. A scribe line (sometimes referred to as a kerf or frame) is an area in a wafer, which is used to singulate or otherwise separate individual dies at the end of wafer processing. Accordingly, in addition to emulating the conductive components of the illustrated GaN-based device 102 (formed on a first die), the test structure 104 can be configured to emulate conductive components of another GaN-based device (formed on a second die). In such embodiments, the test structure 104 may not be present on a singulated die. Moreover, although only one test structure 104 is shown in FIG. 1 that corresponds to a respective GaN-based device, it should be understood that the GaN-based integrated circuit 100 can include any number of test structures corresponding to one GaN-based device to detect its defect(s), while remaining within the scope of the present disclosure.

In some embodiments, the first and second conductive patterns of test structure 104 can be concurrently formed with the conductive components of the GaN-based device 102. Further, the first and second conductive patterns can be formed on or in GaN-based material(s) that are also concurrently formed with the active components of GaN-based materials in the GaN-based device 102. By examining electrical characteristics of the test structure 104 (e.g., whether an open or short circuit exists between the first and second patterns), the test structure 104 can determine if there is a defect present between the first and second patterns, which can efficiently and accurately help determine if there is also a defect likely present in or between the corresponding conductive components of the GaN-based device 102.

Still further, the first and second conductive patterns of test structure 104 can be formed with a pitch substantially smaller than a pitch of the conductive components in the GaN-based device 102. As such, the test structure 104 can advantageously enhance its sensitivity in detecting defects formed therein (which are also likely present in the GaN-based device 102).

In some embodiments, the first and second conductive patterns of the test structure 104 may be formed as an alternately arranged structure or a metal-insulator-metal (MIM) structure. When formed as the alternately arranged structure, the first and second conductive patterns may each have a base portion and a number of protruding portions extending away from the base portion. The respective protruding portions of the first and second conductive patterns are alternatively arranged with each other. Stated another way, each of the protruding portions of the first conductive pattern is laterally disposed between adjacent ones of the protruding portions of the second conductive pattern, with a configurable spacing. The spacing may be in a range from about 0.25 micrometers (μm) to about 6 μm, while other range may be used. In general, the spacing may be configured in accordance with the dimension of possibly induced defects. When formed in the MIM structure, the first and second conductive patterns may respectively have at least a first portion and at least a second portion vertically overlapped with each other.

In some embodiments, the first and second conductive patterns of the test structure 104 can emulate at least seven combinations of conductive components of the GaN-based device 102, as listed in Table below. In brief overview, the conductive components can include a gate electrode (G), a field plate (FP), an ohmic contact (Ohmic), a p-doped GaN region (p-GaN), and a conductive line of a metallization layer (M1). Further, the first and second conductive patterns of the test structure 104 can be formed as an alternately arranged structure or an MIM structure. When formed as a alternately arranged structure, a spacing between respectively portions of the first and second conductive patterns can be configured from about 0.25 micrometers to about 6 micrometers, and the ratio of an area occupied by the test structure 104 to an area of the GaN-based device 102 can be configured from about 1% to about 10%; and when formed as an MIM structure, the ratio of an area occupied by the test structure 104 to an area of the GaN-based device 102 can be configured from about 1% to about 10%. Details of such combinations of emulated conductive components will be discussed below based on an example GaN-based device shown in FIG. 3.

TABLE

| Emulated Conductive Components | Spacing/Area Ratio |
|---|---|
| G/FP (Alternately Arranged) | 0.25~6 μm/1~10% |
| FP/FP (Alternately Arranged) | 0.25~6 μm/1~10% |
| Ohmic/FP (Alternately Arranged) | 0.25~6 μm/1~10% |
| Ohmic/p-GaN (Alternately Arranged) | 0.25~6 μm/1~10% |
| M1/FP (MIM) | 1~10% |
| FP/FP (MIM) | 1~10% |
| Ohmic/FP (MIM) | 1~10% |

Figure 2:
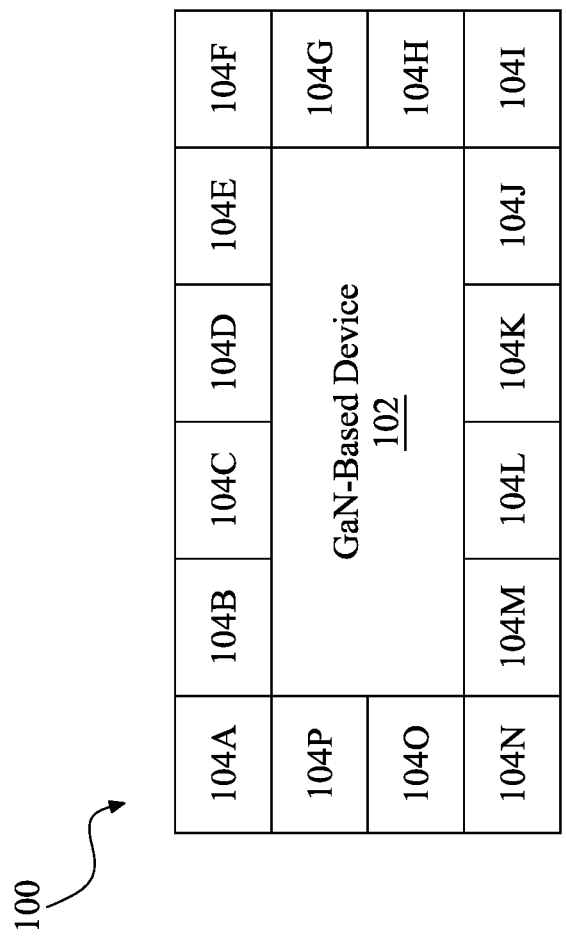
FIG. 2 illustrates an example arrangement of a GaN-based device and plural test structures of the GaN-based integrated circuit of FIG. 1 in accordance with various embodiments.

FIG. 2 illustrates an example arrangement of a plural number of test structures, 104A, 104B, 104C, 104D, 104E, 104F, 104G, 104H, 104I, 104J, 104K, 104L, 104M, 104N, 104O, and 104P, disposed next to the GaN-based device 102, in accordance with various embodiments. As shown, the test structures 104A to 104P may be arranged as a ring surrounding the GaN-based device 102. Although sixteen test structures are formed around the GaN-based device 102, it should be understood that any number of test structures can be formed around the GaN-based device 102. Further, the test structures formed around the GaN-based device 102 can be arranged in any of various other configurations, while remaining within the scope of the present disclosure. In accordance with various embodiments, each of the test structures 104A to 104P may include a first conductive pattern and a second conductive pattern that emulate the conductive components of the GaN-based device 102 listed above in the Table, respectively. For example, some of the test structures 104A to 104P (e.g., 104A and 104B) may emulate the similar conductive components of the GaN-based device 102 (e.g., G/FP), but with respectively different spacings.

Figure 3:
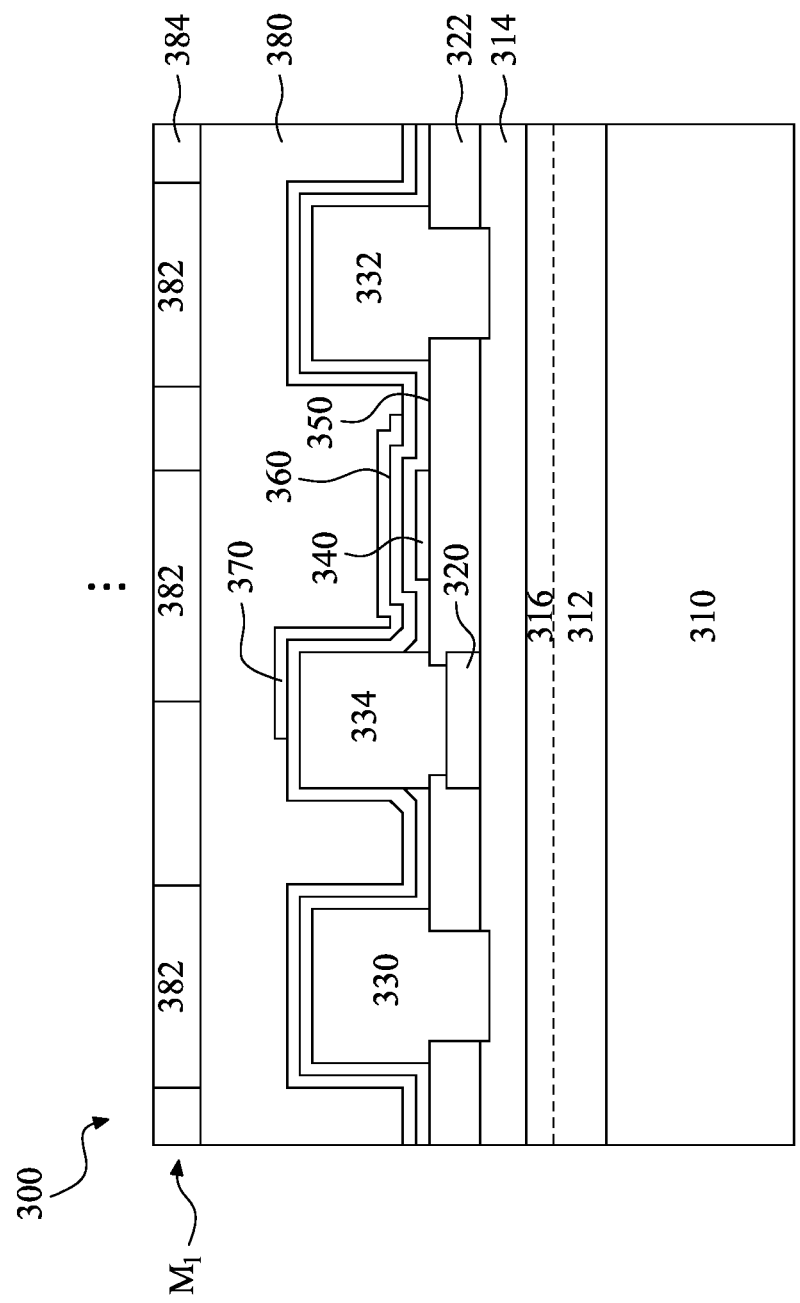
FIG. 3 illustrates a cross-sectional view of a GaN-based device, in accordance with various embodiments.

FIG. 3 illustrates an example GaN-based device 300 that can be implemented as the GaN-based device 102 of the GaN-based integrated circuit 100, in accordance with various embodiments. The GaN-based device 300 includes at least one of the GaN-based materials (e.g., GaN, AlGaN, InGaN, AlInGaN, etc.) serving as its active element (e.g., the active channel of a transistor). Further, the GaN-based device 300 may be formed on a non-GaN-based substrate (e.g., silicon). As such, the GaN-based device 300 has one or more GaN-based materials epitaxially grown on a non-GaN-based substrate, which may have some of the above-identified defects present in a layer of the GaN-based material or at an interface of different GaN-based layers.

The GaN-based device 300 may be implemented as a power transistor that can be operated with a high voltage level, in some embodiments. For example, the device 300 may be a high electron mobility transistor (HEMT) having a high current density, high breakdown voltage (an ability of the HEMT to withstand a high gate and/or drain voltage without being damaged and/or exhibiting irregular current behaviors), and low ON resistance, which allows the device 300 to sustain operation with a voltage range of about 40 volts to about 650 volts. Accordingly, the device 300 may sometimes be referred to as a "power HEMT 300." A two-dimensional electron gas (2DEG), which will be discussed below, is typically used as charge carriers in such a HEMT.

As shown in the cross-sectional view of FIG. 3, the power HEMT 300 includes a substrate 310, a first III-V compound (e.g., including one or more GaN-based materials) layer 312 formed on the substrate 310, and a second III-V compound (e.g., including one or more GaN-based materials) layer 314 formed on the first layer 312.

It should be understood that the power HEMT 300 of FIG. 3 is an illustrative example, and thus, the power HEMT 300 can include any of various other layers while remaining within the scope of the present disclosure. For example, the power HEMT 300 can further include a buffer layer and a transition layer between the substrate 310 and the first layer 312. The buffer layer can define a high resistivity layer for increasing the breakdown voltage of the power HEMT 300 (e.g., up to about 650 volts). In some embodiments, the buffer layer includes one or more of the GaN-based materials (e.g., GaN, AlGaN, InGaN, InAlGaN, etc.). The transition layer can facilitate gradual changes of lattice structures and thermal expansion coefficients between the substrate 310 and an overlying layer, such as the first layer 312. In some embodiments, the transition layer includes a graded aluminum-gallium nitride ($Al_xGa_{(1-x)}N$, x is the aluminum content ratio in the aluminum-gallium constituent, $0<x<1$) layer. In some embodiments, the graded aluminum gallium nitride layer includes multiple layers each having a decreased ratio x, from a bottom layer adjacent the substrate 310 to a top layer adjacent the first layer 312.

The substrate 310 is a semiconductor substrate. In some embodiments, the semiconductor substrate 310 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The substrate 310 may also include various doped regions, dielectric features, or multilevel interconnects in the semiconductor substrate.

The first III-V compound layer 312 and the second III-V compound layer 314 are compounds made from the III-V groups in the periodic table of elements. However, the first III-V compound layer 312 and the second III-V compound layer 314 are different from each other in composition. In some embodiments, the first III-V compound layer 312 includes a gallium nitride (GaN) layer (also referred to as the GaN layer 312). The GaN layer 312 can be epitaxially grown by a number of processes including, but not limited to, metal organic chemical vapor deposition (MOCVD), also known as metal organic vapor phase epitaxy (MOVPE), using appropriate nitrogen and gallium containing precursors. For example, exemplary gallium containing precursors are trimethlgallium (TMG), triethylgallium (TEG) or other suitable chemical precursors. Example nitrogen precursors include, but are not limited to, phenyl hydrazine, dimethylhydrazine, tertiarybutylamine, ammonia, or other suitable chemical precursors.

In some embodiments, the second III-V compound layer 314 includes an aluminum gallium nitride (AlGaN) layer (also referred to as the AlGaN layer 314). The AlGaN layer 314 can be epitaxially grown by MOCVD using appropriate aluminum, nitrogen and gallium precursors. The aluminum precursor includes trimethylaluminum (TMA), triethylaluminum (TEA), or suitable chemical precursors. Example gallium containing precursors are trimethlgallium (TMG), triethylgallium (TEG) or other suitable chemical precursors. Example nitrogen precursors include, but are not limited to, phenyl hydrazine, dimethylhydrazine, tertiarybutylamine, ammonia, or other suitable chemical precursors. The AlGaN layer 314 can also be referred to as a barrier layer. The GaN layer 312 and the AlGaN layer 314 directly contact each other. A transition layer, usually present between the substrate 310 and the GaN layer 312, is not shown.

Different materials formed on the semiconductor substrate 310 causes the layers to have different band gaps. A band gap discontinuity between the GaN layer 312 and the AlGaN layer 314, along with the piezo-electric effect, creates a very thin layer 316 of highly mobile conducting electrons in the GaN layer 312. The thin layer 316 contributes to a conductive two dimensional electron gas (2DEG) region near the junction of the two layers. The thin layer 316 (also referred to as the 2DEG region 316) allows charge to flow through the device. This barrier layer, such as the AlGaN layer 314 may be doped or undoped. Because the 2DEG region exists under the gate at zero gate bias, most nitride devices are normally on, or depletion mode devices.

The power HEMT 300 further includes a doped GaN region 320 over the AlGaN layer 314. In some embodiments, a mask layer, such as a photoresist layer is formed on a blanket doped GaN layer. The blanket doped GaN layer may be a doped III-V compound layer, such a p-type doped GaN layer (also referred to as the doped GaN layer). The doped GaN layer can be epitaxially grown by MOCVD using appropriate aluminum, nitrogen and gallium precursors. The aluminum precursor includes trimethylaluminum (TMA), triethylaluminum (TEA), or suitable chemical precursors. Example gallium containing precursors are trimethlgallium (TMG), triethylgallium (TEG) or other suitable chemical precursors. Example nitrogen precursors include, but are not limited to, phenyl hydrazine, dimethylhydrazine, tertiarybutylamine, ammonia, or other suitable chemical precursors. Next, the mask layer is patterned by a lithography process to form a plurality of features and a plurality of openings defined by the features on the doped GaN layer. The pattern of the mask layer is formed according to a predetermined integrated circuit pattern. The lithography process may include photoresist coating, exposing, post-exposure baking, and developing. Then, an etching process is performed to define the doped GaN region 320.

Following the formation of the doped GaN region 320, a dielectric layer 322 is formed over the doped GaN region 320 and the AlGaN layer 314. The dielectric layer 322 can be made of silicon oxide, silicon nitride, silicon oxynitride, silicon carbide, low-dielectric constant dielectric material or a combination thereof. The dielectric layer 322 can be formed by a deposition process, such as an ALD process, a CVD process, or a PVD process. A thickness of the dielectric layer 322 is in a range from about 300 angstrom to about 3000 angstrom.

Next, the dielectric layer 322 is patterned to define a plurality of ohmic contact regions in the dielectric layer 322. For example, the ohmic contact regions may expose a first portion and a second portion of the AlGaN layer 314 to form source electrode 330 and drain electrode 332, respectively. In some embodiments, the dielectric layer 322 is selectively etched and cleaned to define the ohmic contact regions. Example etching processes include sputter etching, reactive gas etching, chemical etching and ion milling.

After defining the ohmic contact regions, an ohmic metal layer is formed on the (patterned) dielectric layer 322 thereby filling the ohmic contact regions. The ohmic metal layer is deposited on the dielectric layer 322. The deposition process can be sputter deposition, evaporation or chemical vapor deposition (CVD). Example ohmic metals include, but are not limited to, Ta, TaN, Pd, W, WSi2, Ti, Al, TiN, AlCu, AlSiCu and Cu. A thickness of the ohmic metal layer is ranging from about 2000 to 5000 angstrom. Post deposition annealing of the ohmic metal layer is then performed to induce any desirable reactions between the ohmic metal and the adjacent AlGaN layer 314. In some embodiments, the ohmic metal layer is formed by rapid thermal annealing (RTA) at an annealing temperature ranging from approximately 800° C. to approximately 900° C.

Next, portions of the ohmic metal layer are removed to form the source electrode 330 and drain electrode 332. The removing process includes performing one or more etching processes. The source electrode 330 and drain electrode 332 are each connected to the AlGaN layer 314 through an ohmic contact. In some embodiments, the source electrode 330 and drain electrode 332 connect to the AlGaN layer 314 directly. Accordingly, the source electrode 330 and drain electrode 332 are sometimes referred to as "ohmic contact 330" and "ohmic contact 332," respectively.

Next, a first field plate 340 is formed on the dielectric layer 322. The processes of forming the first field plate 340 include forming a field plate metal layer on the dielectric layer 322 and patterning the field plate metal layer. The field plate metal layer can be formed by a deposition process, such as an ALD process, a CVD process, or a PVD process. The patterning process includes performing one or more etching processes. The field plate 340 can be made of TiN, Ti, Al, AlCu, Cu, or other suitable metal. A thickness of the field plate 340 is in a range from about 100 angstrom to about 1200 angstroms. The field plate 340 is disposed adjacent to the doped GaN region 320 and extends toward the ohmic contact 332. The field plate 340 does not cover the doped GaN region 320. The field plate 340 may be electrically connected to one of the ohmic contacts, e.g., the ohmic contact 330.

Next, another dielectric layer 350 is formed over the dielectric layer 322. The dielectric layer 350 also covers the field plate 340 and the ohmic contacts 330-332. The dielectric layer 350 can be made of silicon oxide, silicon nitride, silicon oxynitride, silicon carbide, low-dielectric constant dielectric material or a combination thereof. The dielectric layer 350 can be formed by a deposition process, such as an ALD process, a CVD process, or a PVD process. A thickness of the dielectric layer 350 is in a range from about 500 angstroms to about 5000 angstroms.

Following the formation of the dielectric layer 350, an opening is formed penetrating the dielectric layers 322 and 350 to expose at least a part of the doped GaN region 320. The processes of forming the opening includes forming a mask layer, such as a photoresist layer formed over the dielectric layer 350, and the mask layer is patterned by a lithography process to form a plurality of features and at least one opening defined by the features on the dielectric layer 350. The pattern of the mask layer is formed according to a predetermined integrated circuit pattern, in which the position of the opening of the mask layer is substantially the same as the position of the opening. The lithography process may include photoresist coating, exposing, post-exposure baking, and developing. Then, an etching process is performed to form the opening that exposes the doped GaN region 320.

After the opening is formed to expose the doped GaN region 320, a gate electrode (e.g., formed as a gate metal stack) 334 is formed in the opening and is connected to the doped GaN region 320. The gate electrode 334 is formed on the doped GaN region 320 and is laterally interposed between the source and drain electrodes (e.g., the ohmic contacts 330-332). In some embodiments, the gate electrode 334 includes a conductive material layer, such as a metal layer that functions as a gate electrode configured for voltage bias and electrical coupling with the channel. The metal layer of the gate electrode 334 includes Ti, Mo, Pt, Cr, W, Ni, Al, AlCu, AlSiCu, Cu, or other suitable material. In some other embodiments, the gate electrode 334 may have different compositions. For example, the gate electrode 334 includes one or more junction isolation features interposed between the metal layer and the doped GaN region 320. The junction isolation feature includes one n-type doped semiconductor layer and one aluminum nitride (AlN) layer, which may be configured as a diode.

Next, yet another dielectric layer 360 is formed over the workpiece, e.g., overlaying the dielectric layer 350 and the gate electrode 334. The dielectric layer 360 may be configured as an etch stop layer. The dielectric layer 360 can be made of oxide, SiN, or other suitable material. The dielectric layer 360 is deposited using a suitable vapor deposition processes (e.g., CVD) or another method. Example silicon nitrides (SiN) include amorphous SiN, trisilicon tetranitride, disilicon mononitride, and silicon mononitride. In some embodiments, the dielectric layer 360 is deposited to a thickness ranging from about 100 angstroms to about 1000 angstroms.

In some embodiments, a second field plate 370 is formed on the dielectric layer 360. The processes of forming the second field plate 370 include forming a field plate metal layer on the dielectric layer 362 and patterning the field plate metal layer. The field plate metal layer can be formed by a deposition process, such as an ALD process, a CVD process, or a PVD process. The patterning process includes performing one or more etching processes. The field plate 370 can be made of TiN, Ti, Al, AlCu, Cu, or other suitable metal. A thickness of the field plate 370 is in a range from about 100 angstrom to about 1200 angstroms. The field plate 370 is disposed over a portion of the gate electrode 334 and extends toward the ohmic contact 332. The field plate 370 may also be electrically connected to one of the ohmic contacts, e.g., the ohmic contact 330.

The introduction of the field plate 340/370 can modulate the current collapse effect, and the electric field between the gate electrode 334 and the drain electrode 332 can be redistributed. With the field plate 340/370 formed between gate electrode 334 and the drain electrode 332, the electric field intensity maximum region is expensed toward the drain electrode 332, the peak of electric field between the gate electrode 334 and the drain electrode 332 is reduced, which can greatly improve (increase) the breakdown voltage of the GaN-based device 300.

The power HEMT 300 can further include a number of metallization layers disposed above the foregoing device components. For example in FIG. 3, the power HEMT 300 includes an inter-layer dielectric (ILD) layer 380 deposited over the workpiece. The ILD layer 380 can cover the source electrode 330, the drain electrode 332, the gate electrode 334, and the field plates 340 and 370. The ILD layer 380 is made of a dielectric material. In some embodiments, the ILD layer 380 is made of low dielectric constant materials such as, for example, oxide, fluorinated silica glass (FSG), SiLK™, SiN, or other suitable dielectric material. In some embodiments, an annealing process may be carried out to improve the electrical insulation characteristics of the ILD layer 380. Additionally, the ILD layer 380 may be doped, such as carbon doped oxide or boron/phosphorus doped oxide, to improve its step coverage and annealing characteristics. The surface of the ILD layer 380 is flattened. The process of flattening the ILD layer 380 includes performing a CMP process.

Over the ILD layer 380, the power HEMT 300 can further include a number of metallization layers (e.g., M1), each of which includes a number of conductive lines, e.g., 382, embedded in an inter-metal dielectric (IMD) layer 384. The conductive lines 382 are made of Ti, Mo, Pt, Cr, W, Ni, Al, AlCu, AlSiCu, Cu, or other suitable material. The IMD layer 384 may be formed of the similar material to the ILD layer 380. The IMD layer 384 is utilized to isolate and support capacitor features such as parallel conductive metal lines.

Referring again to the Table shown above, the first and second conductive patterns of the disclosed test structure (104 of FIGS. 1-2) can emulate one or more of the conductive components of a corresponding GaN-based device (102 of FIGS. 1-2). Each of the combinations of the emulated conductive components in the Table will be illustrated below by using the power HEMT 300 as a representative example for the emulated GaN-based device. It should be understood that the power HEMT 300 is provided as an illustrative example, and thus, the conductive components of a GaN-based device that can be emulated by the disclosed test structure can be configured otherwise, while remaining within the scope of the present disclosure.

For example, the first and second conductive patterns can be concurrently formed with the gate electrode (G) 334 and the first field plate (FP) 340, respectively, so as to induce whether a defect is possibly present somewhere between the gate electrode 334 and the first field plate 340. For example, the defect may be in, on, or electrically coupled to a portion of any of the dielectric layer 322, AlGaN layer 314, or GaN layer 312 laterally interposed between the gate electrode 334 and the first field plate 340. Such first and second conductive patterns can be formed as an alternately arranged structure. That is, the first conductive pattern, concurrently formed with the gate electrode 334, can have a number of protruding portions alternately arranged with a number of protruding portions of the second conductive pattern, concurrently formed with the first field plate 340. A lateral spacing between the different protruding portions can be configured in a range from about 0.25 micrometers to about 6 micrometers. As such, a defect, if present between the first and second conductive patterns, can be detected if its dimension is not less than 0.25 micrometers. Further, the first and second conductive patterns (i.e., the test structure 104) may occupy a relatively small area when compared to an area occupied by the emulated GaN-based device 102, for example, a ratio from about 1% up to about 10%, in some embodiments.

In another example, the first and second conductive patterns can be concurrently formed with the first field plate (FP) 340 and the second field plate (FP) 370, respectively, so as to induce whether a defect is possibly present somewhere between the first field plate 340 and the second field plate 370. For example, the defect may be in, on, or coupled to a portion of the dielectric layer 350/360 interposed between the first field plate 340 and the second field plate 370. Such first and second conductive patterns can be formed as an alternately arranged structure. That is, the first conductive pattern, concurrently formed with the first field plate 340, can have a number of protruding portions alternately arranged with a number of protruding portions of the second conductive pattern, concurrently formed with the second field plate 370. A lateral spacing between the different protruding portions can be configured in a range from about 0.25 micrometers to about 6 micrometers. As such, a defect, if present between the first and second conductive patterns, can be detected if its dimension is not less than 0.25 micrometers. Further, the first and second conductive patterns (i.e., the test structure 104) may occupy a relatively small area when compared to an area occupied by the emulated GaN-based device 102, for example, a ratio from about 1% up to about 10%, in some embodiments.

In yet another example, the first and second conductive patterns can be concurrently formed with the ohmic contact (Ohmic) 330/332 and the first field plate (FP) 340, respectively, so as to induce whether a defect is possibly present somewhere between one of the ohmic contact 330 or 332 and the first field plate 340. For example, the defect may be in, on, or coupled to a portion of any of the dielectric layer 322, AlGaN layer 314, or GaN layer 312 laterally interposed between the first field plate 340 and the ohmic contact 332. Such first and second conductive patterns can be formed as an alternately arranged structure. That is, the first conductive pattern, concurrently formed with the ohmic contact 332, can have a number of protruding portions alternately arranged with a number of protruding portions of the second conductive pattern, concurrently formed with the first field plate 340. A lateral spacing between the different protruding portions can be configured in a range from about 0.25 micrometers to about 6 micrometers. As such, a defect, if present between the first and second conductive patterns, can be detected if its dimension is not less than 0.25 micrometers. Further, the first and second conductive patterns (i.e., the test structure 104) may occupy a relatively small area when compared to an area occupied by the emulated GaN-based device 102, for example, a ratio from about 1% up to about 10%, in some embodiments In yet another example, the first and second conductive patterns can be concurrently formed with the ohmic contact (Ohmic) 330/332 and the doped GaN region (p-GaN) 320, respectively, so as to induce whether a defect is possibly present somewhere between one of the ohmic contact 330 or 332 and the doped GaN region 320. For example, the defect may be in, on, or coupled to a portion of any of the dielectric layer 322, AlGaN layer 314, or GaN layer 312 laterally interposed between the doped GaN region 320 and the ohmic contact 330. Such first and second conductive patterns can be formed as an alternately arranged structure. That is, the first conductive pattern, concurrently formed with the ohmic contact 330, can have a number of protruding portions alternately arranged with a number of protruding portions of the second conductive pattern, concurrently formed with the doped GaN region 320. A lateral spacing between the different protruding portions can be configured in a range from about 0.25 micrometers to about 6 micrometers. As such, a defect, if present between the first and second conductive patterns, can be detected if its dimension is not less than 0.25 micrometers. Further, the first and second conductive patterns (i.e., the test structure 104) may occupy a relatively small area when compared to an area occupied by the emulated GaN-based device 102, for example, a ratio from about 1% up to about 10%, in some embodiments.

In yet another example, the first and second conductive patterns can be concurrently formed with the conductive lines (M1) 382 and the field plate (FP) 340/370, respectively, so as to induce whether a defect is possibly present somewhere between one of the conductive lines 382 and the field plate (FP) 340/370. For example, the defect may be in a portion of the ILD layer 380 vertically interposed between one of the conductive lines 382 and the field plate 370. Such first and second conductive patterns can be formed in an MIM structure. That is, the first conductive pattern, concurrently formed with the conductive lines 382, can have at least a portion vertically overlapped with at least a portion of the second conductive pattern, concurrently formed with the field plate 370. Further, the first and second conductive patterns (i.e., the test structure 104) may occupy a relatively small area when compared to an area occupied by the emulated GaN-based device 102, for example, a ratio from about 1% up to about 10%, in some embodiments.

In yet another example, the first and second conductive patterns can be concurrently formed with the first field plate (FP) 340 and the second field plate (FP) 370, respectively, so as to induce whether a defect is possibly present somewhere between the field plates 340 and 370, e.g., in a portion of the dielectric layer 350/360 vertically interposed between the field plates 340 and 370. Such first and second conductive patterns can be formed in an MIM structure. That is, the first conductive pattern, concurrently formed with the first field plate 340, can have at least a portion vertically overlapped with at least a portion of the second conductive pattern, concurrently formed with the second field plate 370. Further, the first and second conductive patterns (i.e., the test structure 104) may occupy a relatively small area when compared to an area occupied by the emulated GaN-based device 102, for example, a ratio from about 1% up to about 10%, in some embodiments.

In yet another example, the first and second conductive patterns can be concurrently formed with the ohmic contact 330/332 and the field plate (FP) 370, respectively, so as to induce whether a defect is possibly present somewhere between one of the ohmic contacts 330-332 and the field plate 370. For example, the defect may be in a portion of the dielectric layer 350/360 laterally interposed between the field plate 370 and the ohmic contact 332. Such first and second conductive patterns can be formed in an MIM structure. That is, the first conductive pattern, concurrently formed with the ohmic contact 330/332, can have at least a portion vertically overlapped with at least a portion of the second conductive pattern, concurrently formed with the field plate 370. Further, the first and second conductive patterns (i.e., the test structure 104) may occupy a relatively small area when compared to an area occupied by the emulated GaN-based device 102, for example, a ratio from about 1% up to about 10%, in some embodiments.

Although the first and second conductive patterns of the disclosed test structure (e.g., 104 of FIG. 1) are concurrently formed with the conductive components of a corresponding GaN-based device, it should be understood that the dimensions and profiles of the first and second conductive patterns can be more flexibly configured. This is because the first and second conductive patterns are generally not configured as part of an active device of the whole GaN-based integrated circuit (e.g., 100 of FIG. 1). Instead, the first and second conductive patterns are configured to emulate the conductive components of an active device in the GaN-based integrated circuit (e.g., 102 of FIG. 1) so as to induce whether a defect is present in, on, or coupled to any of the layers of the active GaN-based device.

Figure 4:
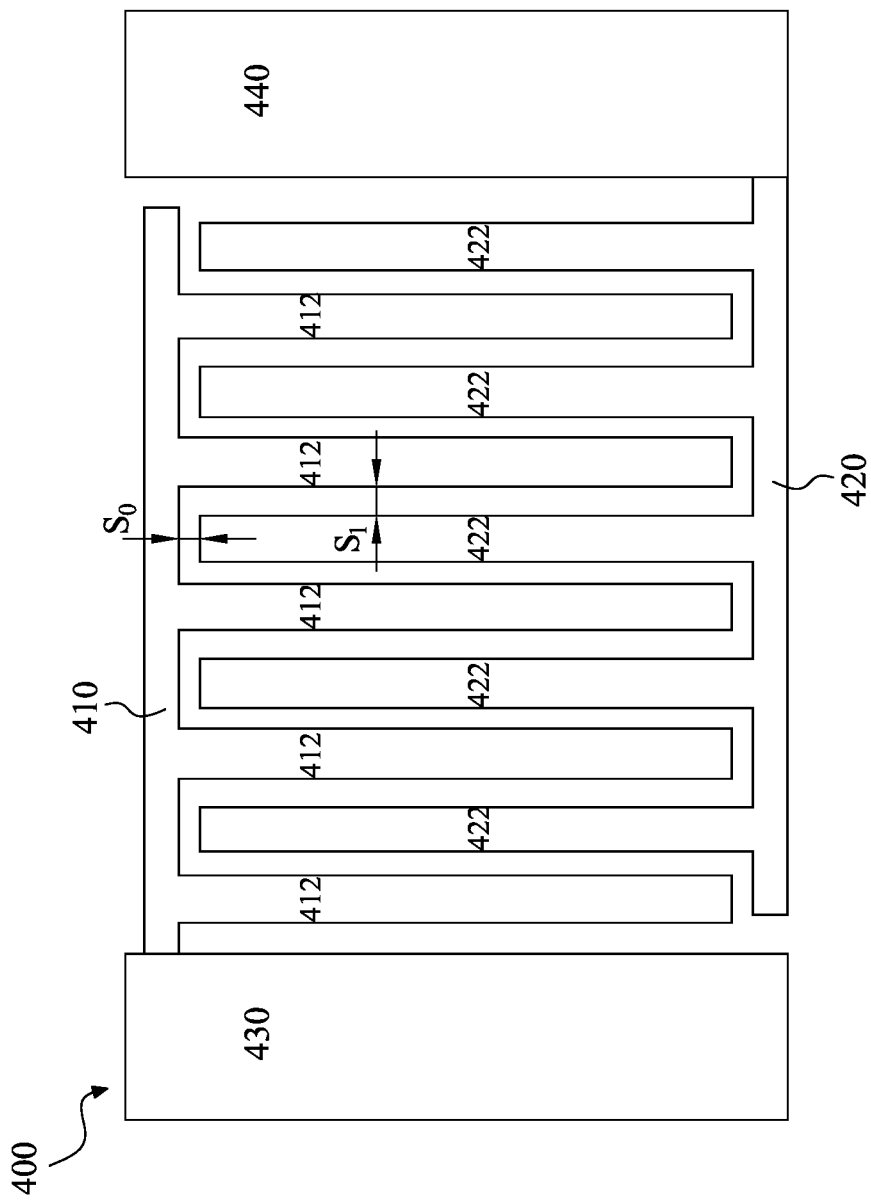
FIGS. 4, 5, 6, 7, 8, and 9 illustrate various arrangements of a test structure emulating a GaN-based device, respectively, in accordance with various embodiments.
Figure 6:
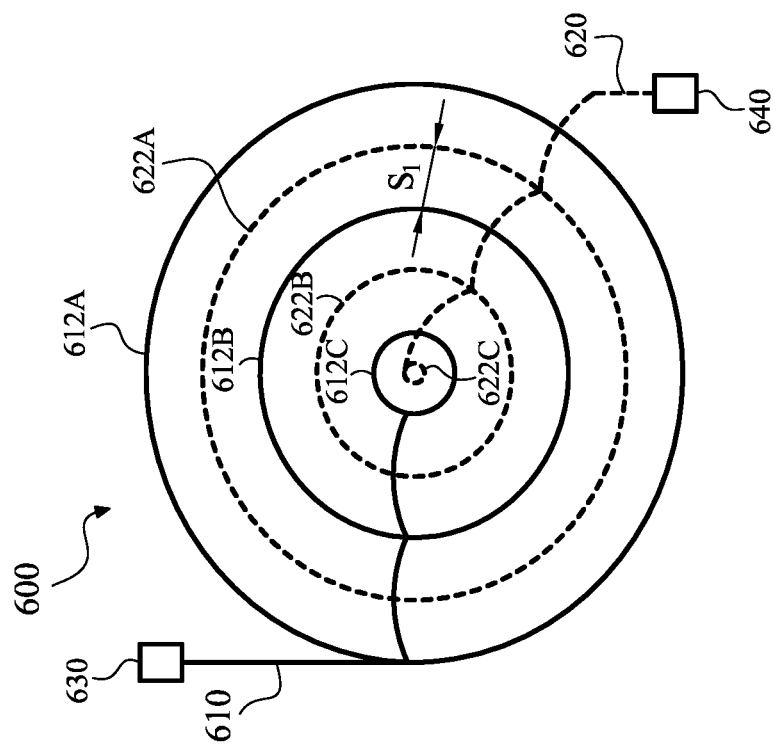
Figure 5:
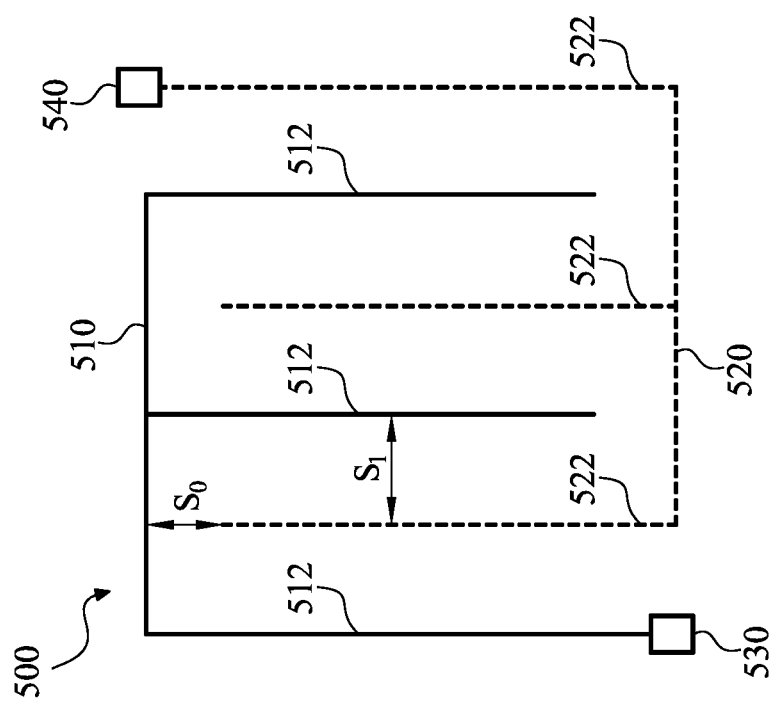
Figure 9:
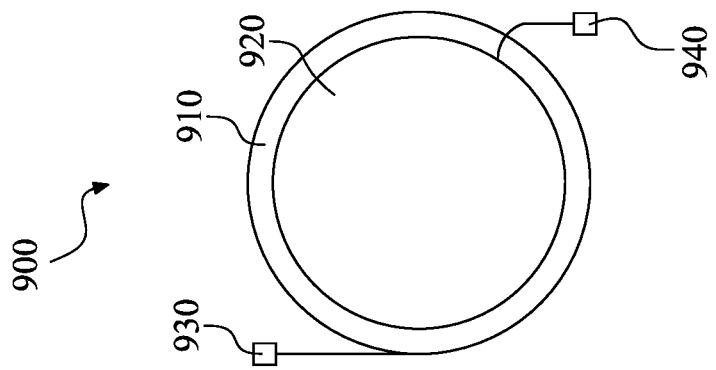
Figure 8:
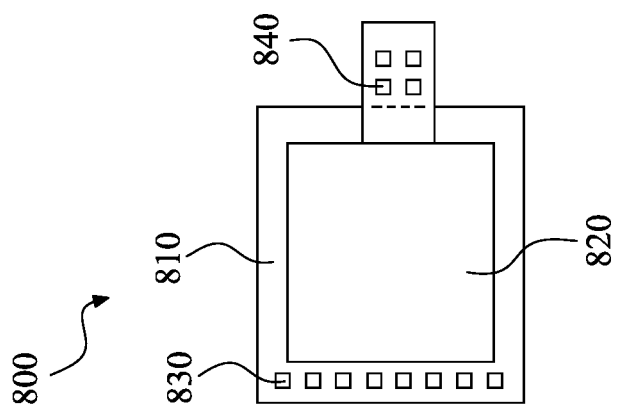
Figure 7:
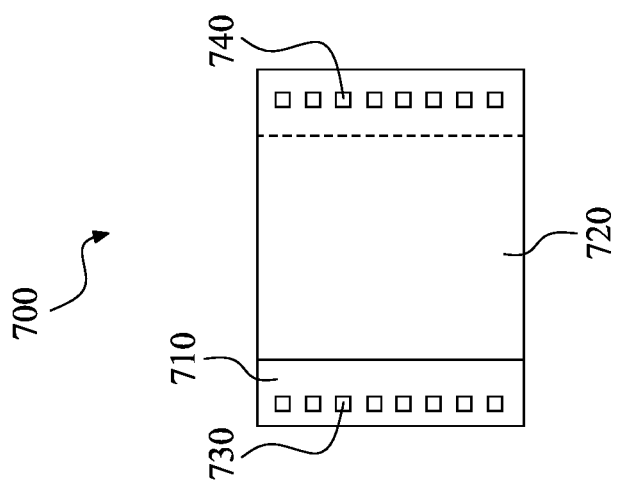

FIGS. 4, 5, 6, 7, 8, and 9 respectively illustrate various example arrangements, 400, 500, 600, 700, 800, and 900, of the first and second conductive patterns of the disclosed test structure, in accordance with various embodiments of the present disclosure. For example, the arrangements 400 to 600 of FIGS. 4-6 show the first and second conductive patterns formed as an alternately arranged structure; and the arrangements 700 to 900 of FIGS. 7-9 show the first and second conductive patterns formed as an MIM structure.

In the arrangement 400 of FIG. 4, the first conductive pattern includes a base portion 410 and a plural number of protruding portions 412 extending away from the base portion 410, and the second conductive pattern includes a base portion 420 and a plural number of protruding portions 422 extending away from the base portion 420. A farthest end of the protruding portion 412 from the base portion 410 is spaced apart from the base portion 420 with a spacing "$S_0$." Similarly, a farthest end of the protruding portion 422 from the base portion 420 is spaced apart from the base portion 410 with a spacing "$S_0$." Specifically, the protruding portions 412 and the protruding portions 422 are alternately arranged with one another. For example, one of the protruding portions 412 is (e.g., laterally) interposed between a corresponding pair of the protruding portions 422 with a spacing "$S_1$." In some embodiments, the spacing $S_0/S_1$ can be configured in a range of about 0.25 micrometers and about 6 micrometers. The arrangement 400 may further include connection pads (or test terminals) 430 and 440, connected to the first conductive pattern and the second conductive pattern, respectively. The connection pads 430-440 may be electrically connected to the respective probes of a test system so as to detect whether a defect is present on the first conductive pattern and/or second conductive pattern, which will be discussed in further detail below.

In the arrangement 500 of FIG. 5, the first conductive pattern includes a base portion 510 and a plural number of protruding portions 512 extending away from the base portion 510, and the second conductive pattern includes a base portion 520 and a plural number of protruding portions 522 extending away from the base portion 520. A farthest end of the protruding portion 512 from the base portion 510 is spaced apart from the base portion 520 with a spacing "$S_0$." Similarly, a farthest end of the protruding portion 522 from the base portion 520 is spaced apart from the base portion 510 with a spacing "$S_0$." Specifically, the protruding portions 512 and the protruding portions 522 are alternately arranged with one another. For example, one of the protruding portions 512 is (e.g., laterally) interposed between a corresponding pair of the protruding portions 522 with a spacing "$S_1$." In some embodiments, the spacing $S_0/S_1$ can be configured in a range of about 0.25 micrometers and about 6 micrometers. The arrangement 500 may further include connection pads (or test terminals) 530 and 540, connected to the first conductive pattern and the second conductive pattern, respectively. The connection pads 530-540 may be electrically connected to the respective probes of a test system so as to detect whether a defect is present on the first conductive pattern and/or second conductive pattern, which will be discussed in further detail below.

In the arrangement 600 of FIG. 6, the first conductive pattern includes a base portion 610 and a plural number of circular portions, 612A, 612B, and 612C, coupled to the base portion 610, and the second conductive pattern includes a base portion 620 and a plural number of circular portions, 622A, 622B, and 622C, coupled to the base portion 620. The circular portions 612A to 612C and 622A to 622C may form a plural number of concentric circles. Specifically, the circular portions 612A-C and the circular portions 622A-C are alternately arranged with one another. For example, one of the circular portions 612A-C is (e.g., laterally) interposed between a corresponding pair of the circular portions 622A-C with a spacing "$S_1$." In some embodiments, the spacing Si can be configured in a range of about 0.25 micrometers and about 6 micrometers. The arrangement 600 may further include connection pads (or test terminals) 630 and 640, connected to the first conductive pattern and the second conductive pattern, respectively. The connection pads 630-640 may be electrically connected to the respective probes of a test system so as to detect whether a defect is present on the first conductive pattern and/or second conductive pattern, which will be discussed in further detail below.

In the arrangement 700 of FIG. 7, the first conductive pattern includes a base portion 710 and the second conductive pattern includes a base portion 720, wherein the base portion 710 and the base portion 720 respectively have at least certain portions vertically overlapped with each other. The base portion 710 and the base portion 720 may have similar dimensions (e.g., areas), and both may be formed in a rectangular or square shape. The base portion 710 and the base portion 720 may be laterally offset from each other to allow connections pads 730 and connection pads 740 to connect to them, respectively. The connections pads 730-740 may each be implemented as a via structure, in some embodiments. The connections pads 730-740 may be electrically connected to the respective probes of a test system so as to detect whether a defect is present on the first conductive pattern and/or second conductive pattern, which will be discussed in further detail below.

In the arrangement 800 of FIG. 8, the first conductive pattern includes a base portion 810 and the second conductive pattern includes a base portion 820, wherein the base portion 810 and the base portion 820 respectively have at least certain portions vertically overlapped with each other.

The base portion 810 and the base portion 820 may have respectively different dimensions (e.g., areas), with the smaller one enclosed by the bigger one (when viewed from the top). The base portion 810 and the base portion 820 may be both formed in a rectangular or square shape. The arrangement 800 further includes connections pads 830 and connection pads 840 to connect to the base portion 810 and the base portion 820, respectively. The connections pads 830-840 may each be implemented as a via structure, in some embodiments. The connections pads 830-840 may be electrically connected to the respective probes of a test system so as to detect whether a defect is present on the first conductive pattern and/or second conductive pattern, which will be discussed in further detail below.

In the arrangement 900 of FIG. 9, the first conductive pattern includes a base portion 910 and the second conductive pattern includes a base portion 920, wherein the base portion 910 and the base portion 920 respectively have at least certain portions vertically overlapped with each other. The base portion 910 and the base portion 920 may have respectively different dimensions (e.g., areas), with the smaller one enclosed by the bigger one (when viewed from the top). The base portion 910 and the base portion 920 may be both formed in a circular shape. The arrangement 900 further includes connections pads 930 and connection pads 940 to connect to the base portion 910 and the base portion 920, respectively. The connections pads 930-940 may each be implemented as a via structure, in some embodiments. The connections pads 930-940 may be electrically connected to the respective probes of a test system so as to detect whether a defect is present on the first conductive pattern and/or second conductive pattern, which will be discussed in further detail below.

Figure 10:
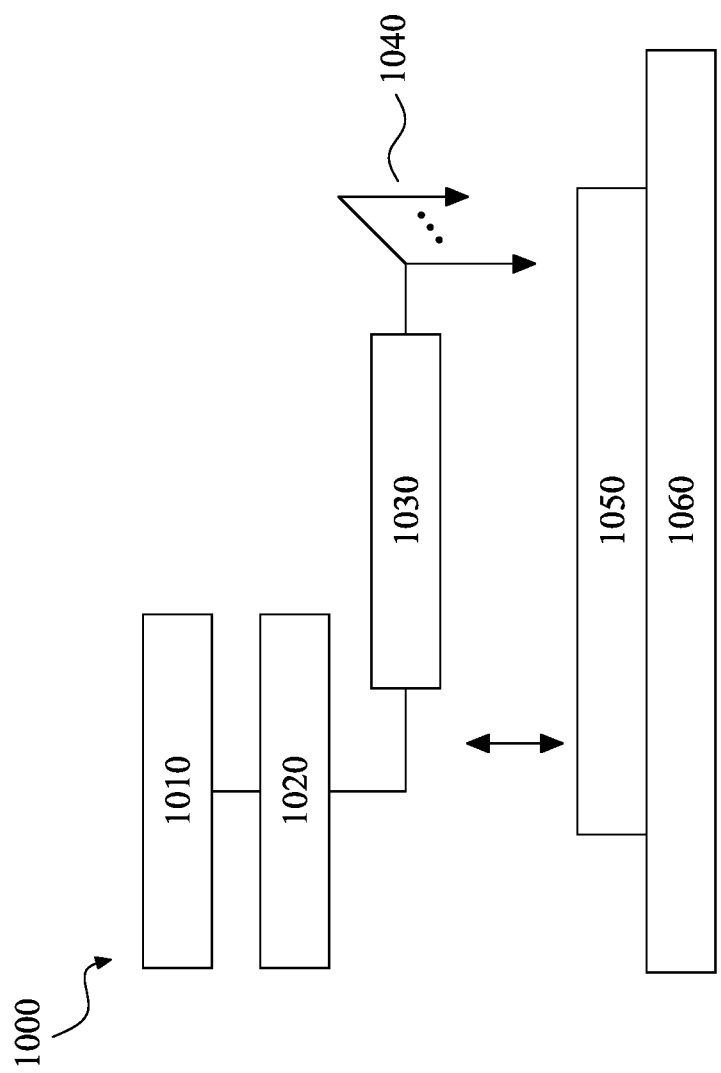
FIG. 10 illustrates a block diagram of a test system for identifying defects of a GaN-based device, in accordance with various embodiments.

FIG. 10 illustrates a simplified block diagram of a test system 1000 that can detect various defects of a GaN-based device, in accordance with various embodiments. Such a to-be-tested GaN-based device can be concurrently fabricated with one or more test structures. Accordingly, the test system 1000 can detect whether a defect is present in the test structure(s) so as to induce whether a defect is also present in the emulated GaN-based device. In one aspect, the test structures and the GaN-based device may be formed on a singulated die as an integrated circuit. In another aspect, the test structures and the GaN-based device may not be formed on a same singulated die, where the test structures may be later removed from an integrated circuit having the GaN-based device (e.g., after the GaN-based device passes the defect test).

As shown, the test system 1000 includes at least a controller 1010 and a signal generator 1020 that are operatively coupled to each other. Although being shown as separate blocks, the signal generator 1020 may be integrated into the controller 1010 while remaining within the scope of present disclosure. In various embodiments, the controller 1010 can determine a number of test signals for a to-be-tested GaN-based device 1050 placed on a support 1060. For example, the test signals can include a positive voltage and a ground voltage respectively applied to the first and second conductive patterns of a test structure emulating the GaN-based device 1050. The voltage can be configured to be higher than 100 volts (e.g., about 650 volts) through a disclosed charge pump, which will be discussed below with respect to FIGS. 11-12. Upon configuring the test signals, the signal generator 1020 can apply those test signals to the GaN-based device 1050 for identifying defects.

The test system 1000 can further include a probe card 1030 that is configured to support a number of probes 1040. In operation, the probe card 1030 is moved until some of the probes 1040 make contact with a corresponding test structure of the GaN-based device 1050. The movement is indicated by the vertical arrows in FIG. 10. Alignment apparatus such as microscopes or visual display equipment with magnification can be used to move the wafer in the X and Y directions so as to place the probes 1040, for example, on one or more of the connection pads (test terminals) of the test structure discussed above. After the probes 1040 are placed in electrical contact with the test terminals, the test signals, as discussed above, can be applied to the test structure (which may or may not be part of the final GaN-based device 1050) for identifying defects. Although not shown, the test system 1000 can include a number of (e.g., voltage and/or current) monitors to monitor a response of the test structure after being applied with those test signals. The monitors can be in electrical contact with the test structure through terminals identical to or different from the test terminals through which the test signals are applied.

Figure 11:
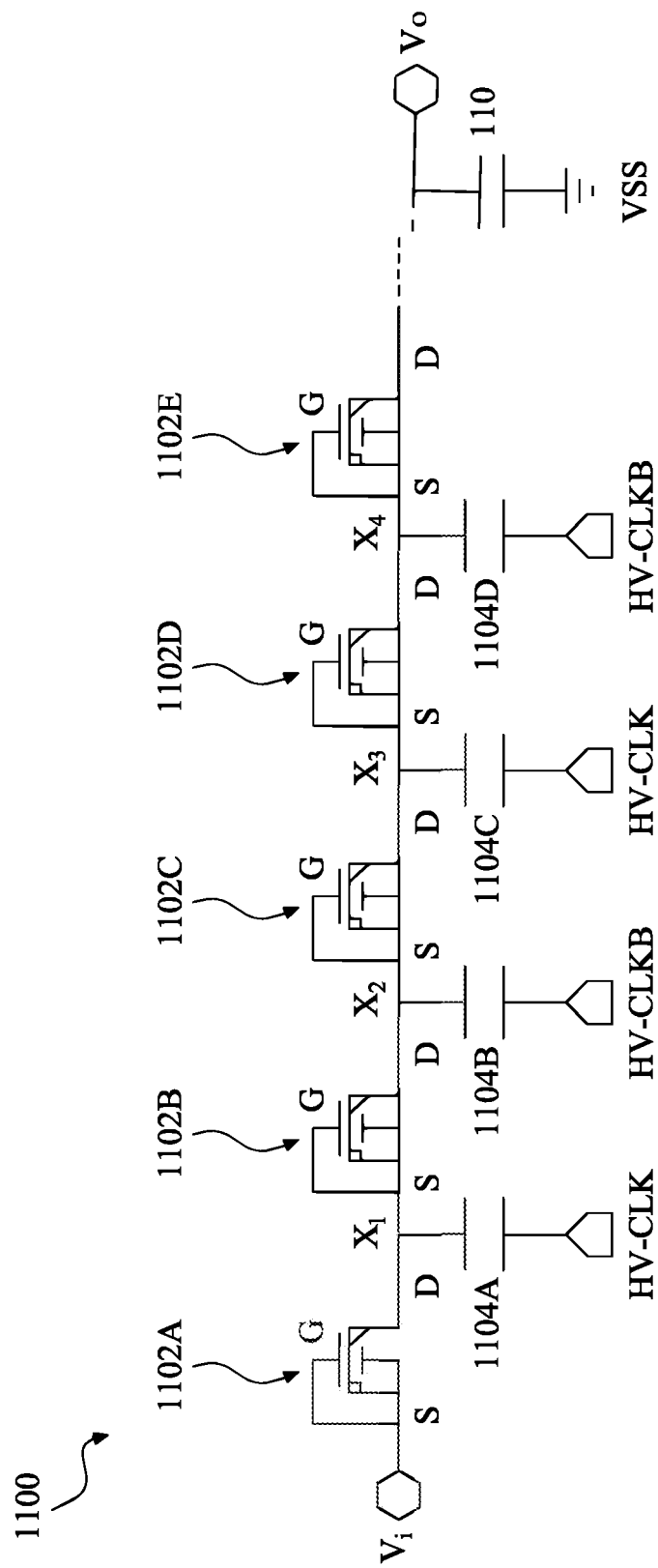
FIG. 11 illustrates a circuit diagram of a high-voltage charge pump, in accordance with various embodiments.
Figure 12:
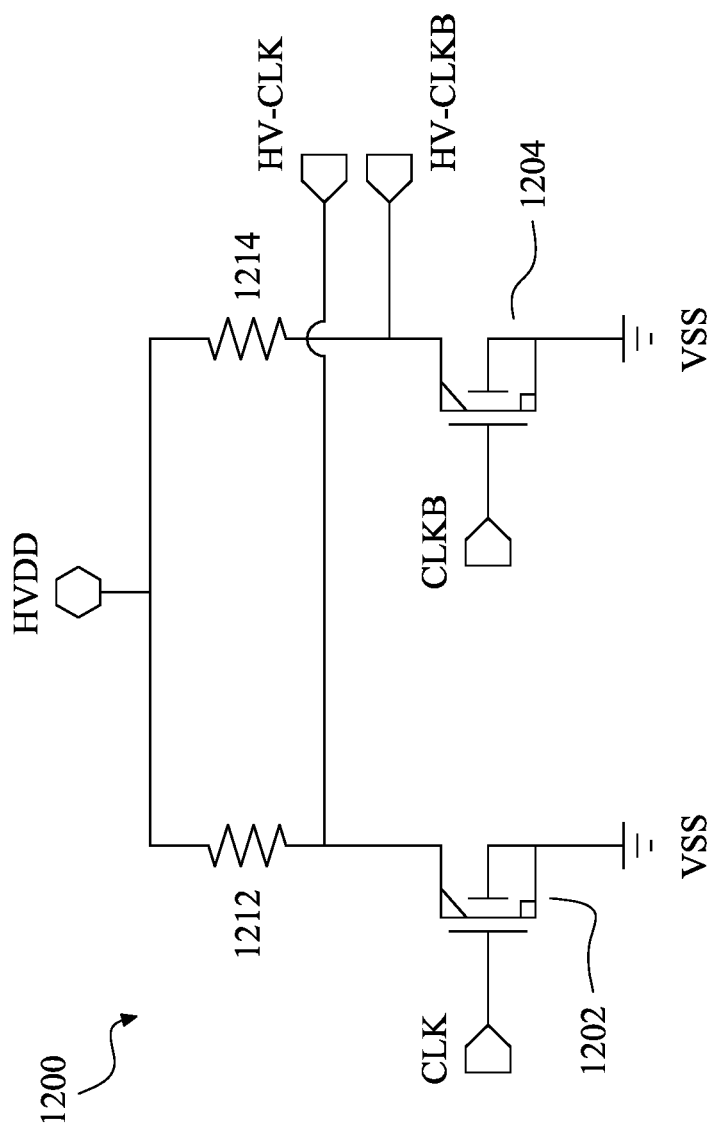
FIG. 12 illustrates a circuit diagram of a high-voltage clock generator operatively coupled to the charge pump of FIG. 11, in accordance with various embodiments.

FIG. 11 illustrates an example circuit diagram of a high-voltage charge pump 1100 that can output a voltage higher than 100 volts, and FIG. 12 illustrates an example circuit diagram of a high-voltage clock generator 1200 that can provide a clock signal (and its corresponding inversed clock signal) with a high voltage to the charge pump 1100, in accordance with various embodiments of the present disclosure.

Referring first to FIG. 11, the charge pump 1100 includes a number (e.g., 5) of GaN-based transistors, 1102A, 1102B, 1102C, 1102D, and 1102E, a number (e.g., 4) of capacitors, 1104A, 1104B, 1104C, and 1104D, and a load capacitor 1106. The charge pump 1100 can receive an input voltage, Vi, and pump or otherwise increase a voltage level of Vi as an output voltage, Vo. Specifically, each of the GaN-based transistors 1102A-E may have its gate and source tied to each other (thereby functioning as a diode), and have its drain connected to a corresponding one of the capacitors 1104A-D and to a next stage of the GaN-based transistors 1102A-E. The other end of each of the capacitors 1104A-D is configured to receive a high-voltage clock signal. Further, the neighboring capacitors (e.g., 1104A and 1104B) are configured to receive opposite high-voltage clock signals, e.g., HV-CLK and HV-CLKB, respectively.

As such, in a first clock cycle where HV-CLK is at low and HV-CLKB is at high, the capacitor 1104A is connected across to the input voltage Vi (e.g., 100 volts) through the diode-connected transistor 1102A, charging the capacitor 1104A to that same voltage. Alternatively stated, node X1 is charged to about 100 volts. In a second (next) clock cycle where HV-CLK is at high and HV-CLKB is at low, the circuit is reconfigured so that the capacitor 1104A is in series, through the diode-connected transistor 1102B, with the HV-CLK being at high and the capacitor 1104B at the next stage. This doubles the voltage at node X1 and node X2—the sum of the original supply (100 volts) and the capacitor voltage (100 volts). Based on this principle, with five stages included in the charge pump 1100, the output voltage Vo may be increased to about 500 volts.

Referring next to FIG. 12, the clock generator 1200 includes a pair of high-voltage transistors (e.g., high-voltage HEMTs) 1202 and 1204 connected between a supply voltage with a high voltage level (HVDD, e.g., about 100 volts) and ground (VSS). Further, the transistors 1202 and 1204 are connected to HVDD through resistors 1212 and 1214, respectively. The transistor 1202 is configured to be gated by a clock signal (CLK), while the transistor 1204 is configured to be gated by an inverse of the clock signal (CLKB). As such, the transistors 1202 and 1204 may be alternately turned on/off/. Accordingly, HV-CLK and HV-CLKB can be output at drains of the transistors 1202 and 1204, respectively.

Figure 13:
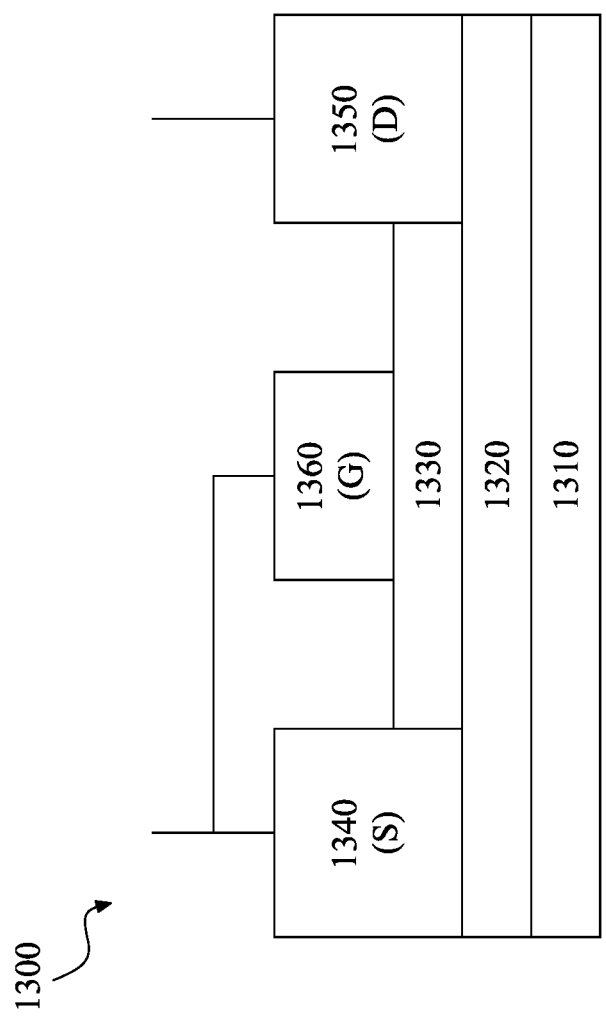
FIG. 13 illustrates a cross-sectional view of a diode-connected transistor implemented by the charge pump of FIG. 11, in accordance with various embodiments.

FIG. 13 illustrates a cross-sectional view of a diode-connected transistor 1300 (e.g., 1102A-E) implemented in the charge pump 1100 (FIG. 11). The diode-connected transistor 1300 includes a substrate 1310, a channel layer 1320 over the substrate 1310, and an active layer 1330 over the channel layer 1320. The channel layer 1320 and active layer 1330 may be substantially similar to the GaN layer 312 and AlGaN layer 314 (FIG. 3), respectively, and thus, the description will not be repeated. With such GaN-based materials, the diode-connected transistor 1300 can be operated at a higher frequency (when compared to Si-based transistors), due to its substantially low parasitic capacitance. The diode-connected transistor 1300 also includes a source electrode 1340 and a drain electrode 1350 over the channel layer 1320, and a gate electrode 1360 over the active layer 1330. In some other embodiments, the source electrode 1340 and the drain electrode 1350 are formed over the active layer 1330. The source electrode 1340 and gate electrode 1360 are shorted together, with the source electrode 1340 and gate electrode 1360 collectively serving as a first terminal (e.g., anode) of the diode-connected transistor 1300 and the drain electrode 1350 serving as a second terminal (e.g., cathode) of the diode-connected transistor 1300.

Figure 14:
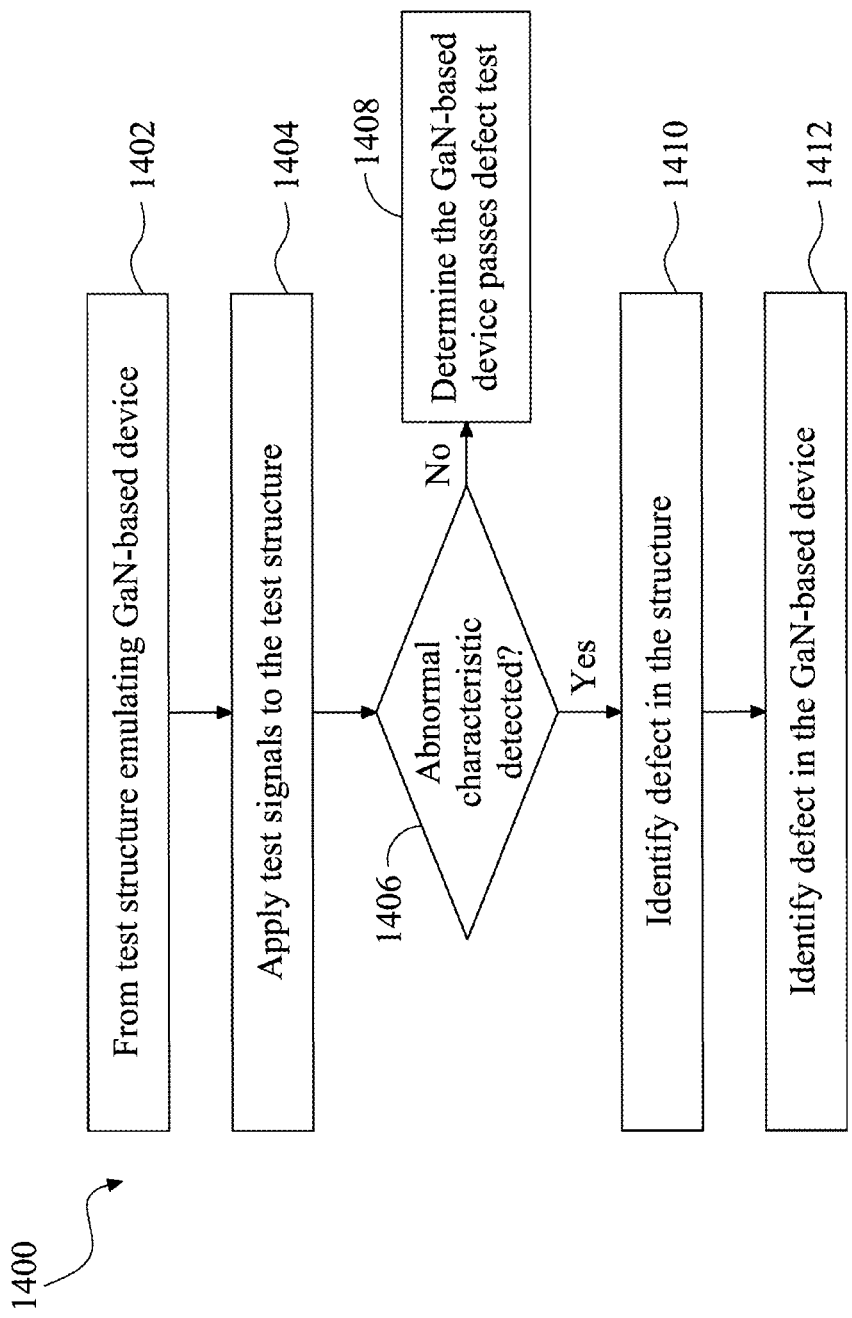
FIG. 14 illustrates an example flow chart of a method for identifying defects of a GaN-based device, in accordance with various embodiments.

Referring now to FIG. 14, depicted is a flow chart of an example method 1400 to identify various defects of a GaN-based device through the disclosed test structure(s), in accordance with various embodiments. The test structure, as disclosed herein, includes a first conductive pattern and a second conductive pattern that can emulate conductive components of the GaN-based device, respectively. Defects in the GaN-based device can be identified based on examining one or more characteristics of the test structure through a test system. Accordingly, the following discussion of FIG. 14 will be conducted in conjunction with some of the above figures (e.g., the power HEMT 300 of FIG. 3, the arrangements 400-900 of the first and second conductive patterns shown in FIGS. 4-9, the test system 1000 of FIG. 10, the charge pump 1100 of FIG. 11, etc.). The illustrated embodiment of the method 1400 is merely an example. Therefore, it is understood that any of a variety of operations may be omitted, re-sequenced, and/or added while remaining within the scope of the present disclosure.

The method 1400 starts with operation 1402 of forming one or more test structures emulating a GaN-based device. Using the arrangement 400 of FIG. 4 as an example, first conductive pattern and second conductive pattern of the test structure, emulating conductive components of the GaN-based device (e.g., emulating its gate electrode and field plate, its different field plates, its ohmic contact and field plate, or its ohmic contact and doped GaN region), can be formed as having their protruding portions 412 and 422 laterally interleaved with each other. Using the arrangement 700 of FIG. 7 as another example, first conductive pattern and second conductive pattern of the test structure, emulating conductive components of the GaN-based device (e.g., emulating its gate electrode and field plate, its different field plates, its ohmic contact and field plate, or its ohmic contact and doped GaN region), can be formed as having their respective portions 710 and 720 vertically overlapped with each other.

Next, the method 1400 proceeds to operation 1404 of applying test signals to the test structure. Continuing with the example of arrangement 400 (while also referring to the test system 1000 of FIG. 10), one probe 1040 can apply a positive voltage to the first conductive pattern (i.e., the base portion 410 and protruding portions 412) through the connection pad 430, and another probe 1040 can apply a ground voltage to the second conductive pattern (i.e., the base portion 420 and protruding portions 422) through the connection pad 440. The test system 1000 can monitor a characteristic (e.g., an IV curve) presented by the first and second conductive patterns. Continuing with the example of arrangement 700 (while also referring to the test system 1000 of FIG. 10 and the charge pump 1100 of FIG. 11), one probe 1040 can apply a positive high voltage (e.g., about 500 volts) to the first conductive pattern (i.e., the base portion 710) through the connection pad 730, and another probe 1040 can apply a ground voltage to the second conductive pattern (i.e., the base portion 720) through the connection pad 740. The test system 1000 can monitor a characteristic (e.g., an IV curve) presented by the first and second conductive patterns.

Next, the method 1400 proceeds to operation 1406 of determining whether there is any abnormal characteristic (or behavior) is detected. If not, the method 1400 may proceed to operation 1408 of determining that the GaN-based device has passed the defect test. On the other hand, the method 1400 may proceed to operations 1410 and 1412 to further identify a defect.

For example, when monitoring the characteristic of the first and second conductive patterns, configured in the arrangement 400, the test system 1000 may expect to detect an open circuit (or an infinite resistance value) between the first and second conductive patterns as they are in electrical isolation from each other. In some scenarios, the test system 1000 does detect an infinite resistance value between the first and second conductive patterns, and the test system 1000 can determine that the GaN-based device has passed the defect test (operation 1408). In some other scenarios, the test system 1000 may detect a finite resistance value, from which the test system 1000 may determine that an abnormal characteristic is detected. The test system 1000 may determine that such a connected path between the first and second conductive patterns is induced by a defect formed between the adjacent protruding portions 412 and 422 (operation 1410). Next, based on which conductive components of the GaN-based device are emulated by the first and second conductive patterns, the test system 1000 can identify a defect that is likely present between the emulated conductive components (operation 1412).

In another example, when monitoring the characteristic (obehavior) of the first and second conductive patterns, configured in the arrangement 700, the test system 1000 may expect to detect a sufficiently high breakdown voltage between the first and second conductive patterns that emulate a gate electrode and field plate of the GaN-based device, respectively, for example. In some scenarios, the test system 1000 does detect such a high breakdown voltage between the first and second conductive patterns, and the test system 1000 can determine that the GaN-based device has passed the defect test (operation 1408). In some other scenarios, the test system 1000 may detect a substantially lower breakdown voltage, from which the test system 1000 may determine that an abnormal characteristic is detected. The test system 1000 may determine that such a decrease in the breakdown voltage is induced by a defect formed between the base portions 710 and 720 (operation 1410). With the help of the disclosed charge pump 1100, one of the first or second conductive pattern can be applied with a high voltage (e.g., higher than 500 volts). As such, even if the defect is not in contact with any of the first or second conductive pattern, the decreased breakdown voltage can still be detected. Next, based on which conductive components of the GaN-based device are emulated by the first and second conductive patterns, the test system 1000 can identify a defect that is likely present between the emulated conductive components (operation 1412).

Figure 15:
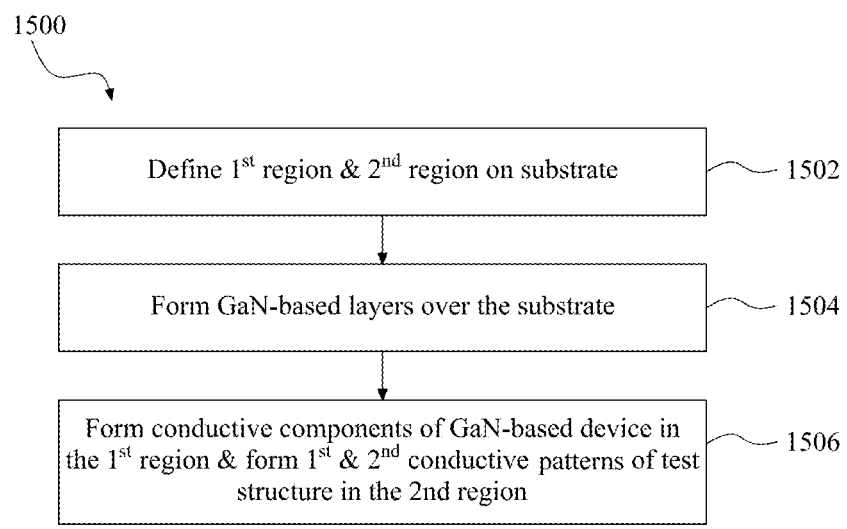
FIG. 15 illustrates an example flow chart of a method for fabricating a GaN-based device and its one or more corresponding test structures, in accordance with various embodiments.

FIG. 15 illustrates a flow chart of an example method 1500 for fabricating one or more test structures concurrently with a corresponding GaN-based device, in accordance with various embodiments. For example, at least some of the operations (or steps) of the method 1500 can be performed to fabricate, make, or otherwise form one or more test structures and a GaN-based device. It is noted that the method 1500 is merely an example, and is not intended to limit the present disclosure. Accordingly, it should be understood that additional operations may be provided before, during, and after the method 1500 of FIG. 15, and that some other operations may only be briefly described herein. In some embodiments, operations of the method 1500 may be discussed in conjunction with some of the above figures (e.g., the GaN-based integrated circuit 100 of FIGS. 1-2, the power HEMT 300 of FIG. 3, the arrangements 400-900 of the first and second conductive patterns shown in FIGS. 4-9, etc.).

The method 1500 starts with operation 1502 of defining a first region and a second region over a substrate. For example, a substrate (e.g., 310) may be provided. On the substrate 310, a first region and second region may be defined to form a GaN-based device and its associated test structures, respectively. Using FIG. 1 as an example, the GaN-based device 102 may be disposed on a first region of the substrate 310 and the test structure 104 may be disposed on a second region of the substrate 310, which surrounds the first region. In another example of FIG. 2, the GaN-based device 102 may be disposed on a first region of the substrate 310 and the test structures 104A-P may be disposed on a second region of the substrate 310, which surround the first region.

Next, the method 1500 continues to operation 1504 of forming, over both the first and second regions of the substrate, a number of layers each having at least one of the GaN-based materials listed above. Using the power HEMT 300 (FIG. 3) as a representative example, the GaN layer 312 and the AlGaN layer 314 are sequentially deposited over the substrate 310, covering both of the first and second region. As mentioned above, one or more other GaN-based layers can be formed over the substrate 310. For example, a buffer layer, that defines a high resistivity layer for increasing the breakdown voltage, and a transition layer, that facilitates gradual changes of lattice structures and thermal expansion coefficients between the substrate 310 and an overlying layer, may be formed between the GaN layer 312 and the substrate 310. In some embodiments, the buffer layer includes one or more of the GaN-based materials (e.g., GaN, AlGaN, InGaN, InAlGaN, etc.), and the transition layer includes a graded aluminum-gallium nitride ($Al_xGa_{(1-x)}N$).

Next, the method 1500 continues to operation 1506 of forming, over the first region, a number of conductive components for a GaN-based device, and forming, over the second region, a first conductive pattern and a second conductive pattern for a test structure. In some embodiments, the conductive components of the GaN-based device and the conductive patterns of the test structure may be concurrently formed, but in the respective first and second regions over the substrate. In this way, the conductive patterns of the test structure can emulate the conductive components of the GaN-based device. Further, while the conductive components may be formed with dimensions and profiles that make the GaN-based device suitable for a desired function, the conductive patterns of the test structure may be intentionally formed with different dimensions and profiles to enhance the test structure's sensitivity in detecting defects.

For example, the first and second conductive patterns of a test structure can emulate its corresponding GaN-based device's gate electrode (e.g., 334 of FIG. 3) and field plate (e.g., 340 of FIG. 3), respectively. While the gate electrode 334 and the field plate 340 may be laterally spaced from each other, the first and second conductive patterns can be formed as an alternatively arranged structure, with their respective protruding portions laterally interleaved with one another (e.g., arrangement 400 of FIG. 4).

For another example, the first and second conductive patterns of a test structure can emulate its corresponding GaN-based device's conductive line (e.g., 382 of FIG. 3) and field plate (e.g., 370 of FIG. 3), respectively. While the conductive line 382 and the field plate 370 may not be vertically overlapped with each other or have their limited portions overlapped with each other, the first and second conductive patterns can be formed as an MIM structure, with their majority portions overlapped with each other (e.g., arrangement 700 of FIG. 7).

In one aspect of the present disclosure, a semiconductor device is disclosed. The semiconductor device includes a transistor comprising: a plurality of layers, wherein each of the plurality of layers has at least one Group III-V compound material; a gate electrode operatively coupled to at least one of the plurality of layers; a source electrode disposed on a first side of the gate electrode; a drain electrode disposed on a second side of the gate electrode; a field plate disposed between the gate electrode and the drain electrode; and a plurality of conductive lines disposed above the gate electrode, the source electrode, and the drain electrode. The semiconductor device further includes a plurality of test structures, wherein each of the test structures, including a first metal pattern and a second metal pattern, emulates at least one of the gate electrode, the source electrode, the drain electrode, the field plate, or at least one of the plurality of conductive lines.

In another aspect of the present disclosure, a semiconductor device is disclosed. The semiconductor device includes a first semiconductor die comprising a plurality of first transistors, wherein each of the plurality of first transistors has at least one Group III-V compound material. The semiconductor device includes a second semiconductor die comprising a plurality of second transistors, wherein each of the plurality of second transistors has the at least one Group III-V compound material. The semiconductor device includes a test structure disposed next to the first semiconductor die and the second semiconductor die. The test structure includes a first metal pattern and a second metal pattern, and is configured to emulate one or more features of each of the first semiconductor die and the second semiconductor die so as to determine a presence of a defect in at least one of the first semiconductor die or the second semiconductor die.

In yet another aspect of the present disclosure, a method for testing semiconductor devices is disclosed. The method includes forming a transistor comprising a plurality of layers, wherein each of the plurality of layers has at least one Group III-V compound material. The method includes forming a test structure comprising a first metal pattern and a second metal pattern, wherein the test structure is configured to emulate one or more features of the transistor. The method includes detecting whether an abnormal behavior exists in a current-voltage curve associated with the test structure. The method includes in response to detecting a presence of the abnormal behavior, determining that the transistor has a defect.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a transistor comprising:
        a plurality of layers, wherein each of the plurality of layers has at least one Group III-V compound material;
        a gate electrode operatively coupled to at least one of the plurality of layers;
        a source electrode disposed on a first side of the gate electrode;
        a drain electrode disposed on a second side of the gate electrode;
        a field plate disposed between the gate electrode and the drain electrode; and
        a plurality of conductive lines disposed above the gate electrode, the source electrode, and the drain electrode; and
    a plurality of test structures, wherein each of the test structures, including a first metal pattern and a second metal pattern, emulates at least one of the gate electrode, the source electrode, the drain electrode, the field plate, or at least one of the plurality of conductive lines.

2. The semiconductor device of claim 1, wherein the plurality of test structures are each disposed immediately next to the transistor.

3. The semiconductor device of claim 1, wherein the first metal pattern includes a first base portion and a plurality of first protruding portions extending away from the first base portion, and the second metal pattern includes a second base portion and a plurality of second protruding portions extending away from the second base portion.

4. The semiconductor device of claim 3, wherein each of the plurality of first protruding portions is laterally disposed between adjacent ones of the plurality of second protruding portions, with a spacing.

5. The semiconductor device of claim 4, wherein the spacing is in a range of about 0.25 micrometers (μm) and about 6 μm.

6. The semiconductor device of claim 1, wherein the first metal pattern includes a first plate and the second metal pattern includes a second plate, and wherein at least a first portion of the first plate and at least a second portion of the second plate are vertically overlapped with each other.

7. The semiconductor device of claim 1, wherein the transistor occupies a first area on a substrate and each of the plurality of test structures occupies a second area on the substrate, and wherein a ratio of the second area to the first area is equal to or less than 10%.

8. The semiconductor device of claim 1, wherein each of the test structures is configured to detect whether a defect is present in the transistor based on whether the corresponding first metal pattern and the corresponding second metal pattern form a short circuit.

9. The semiconductor device of claim 1, further comprising:
    a charge pump connected to one of the corresponding first metal pattern or the corresponding second metal pattern of at least a first one of the test structures;
    wherein the charge pump is formed of at least one Group III-V compound material and configured to provide the connected first metal pattern or the connected second metal pattern with a voltage equal to or greater than 650 volts (V).

10. The semiconductor device of claim 9, wherein the first test structure is configured to detect whether a defect is present in the transistor based on whether an abnormal current-voltage curve associated with the first test structure exists.

11. A semiconductor device, comprising:
    a transistor comprising:
        a plurality of layers, wherein each of the plurality of layers has at least one Group III-V compound material;
        a gate electrode operatively coupled to at least one of the plurality of layers;
        a source electrode disposed on a first side of the gate electrode;
        a drain electrode disposed on a second side of the gate electrode;
        a field plate disposed between the gate electrode and the drain electrode; and
        a plurality of conductive lines disposed above the gate electrode, the source electrode, and the drain electrode; and
    a plurality of test structures, wherein each of the test structures is configured to emulate at least one of the gate electrode, the source electrode, the drain electrode, the field plate, or at least one of the plurality of conductive lines.

12. The semiconductor device of claim 11, wherein the plurality of test structures are each disposed immediately next to the transistor.

13. The semiconductor device of claim 11, wherein each of the test structures includes a first metal pattern and a second metal pattern, wherein the first metal pattern includes a first base portion and a plurality of first protruding portions extending away from the first base portion, and the second metal pattern includes a second base portion and a plurality of second protruding portions extending away from the second base portion.

14. The semiconductor device of claim 13, wherein each of the plurality of first protruding portions is laterally disposed between adjacent ones of the plurality of second protruding portions, with a spacing.

15. The semiconductor device of claim 14, wherein the spacing is in a range of about 0.25 micrometers (μm) and about 6 μm.

16. The semiconductor device of claim 11, wherein the transistor occupies a first area on a substrate and each of the plurality of test structures occupies a second area on the substrate, and wherein a ratio of the second area to the first area is equal to or less than 10%.

17. A semiconductor device, comprising:
a transistor comprising:
a plurality of layers, wherein each of the plurality of layers has at least one Group III-V compound material;
a gate electrode operatively coupled to at least one of the plurality of layers;
a source electrode disposed on a first side of the gate electrode;
a drain electrode disposed on a second side of the gate electrode;
a field plate disposed between the gate electrode and the drain electrode; and
a plurality of conductive lines disposed above the gate electrode, the source electrode, and the drain electrode;
a plurality of test structures, wherein each of the test structures, each including a first metal pattern and a second metal pattern, is configured to emulate at least one of the gate electrode, the source electrode, the drain electrode, the field plate, or at least one of the plurality of conductive lines; and
a charge pump connected to one of the corresponding first metal pattern or the corresponding second metal pattern of at least one of the test structures.

18. The semiconductor device of claim 17, wherein the charge pump is formed of at least one Group III-V compound material and configured to provide the connected first metal pattern or the connected second metal pattern with a voltage equal to or greater than 650 volts (V).

19. The semiconductor device of claim 17, wherein the plurality of test structures are each disposed immediately next to the transistor.

20. The semiconductor device of claim 17, wherein the first metal pattern includes a first base portion and a plurality of first protruding portions extending away from the first base portion, and the second metal pattern includes a second base portion and a plurality of second protruding portions extending away from the second base portion.

* * * * *